United States Patent
Li (10) Patent No.: US 11,705,352 B2
(45) Date of Patent: Jul. 18, 2023

(54) BASE FRAME OF SUBSTRATE CARRIER, SUBSTRATE CARRIER AND SUBSTRATE TRANSFER MECHANISM

(71) Applicants: HKC CORPORATION LIMITED, Shenzhen (CN); CHONGQING HKC OPTOELECTRONICS TECHNOLOGY CO., LTD., Chongqing (CN)

(72) Inventor: Qiaodong Li, Chongqing (CN)

(73) Assignees: HKC CORPORATION LIMITED, Shenzhen (CN); CHONGQING HKC OPTOELECTRONICS TECHNOLOGY CO., LTD, Chongqing (CN)

( * ) Notice: Subject to any disclaimer, the term of this patent is extended or adjusted under 35 U.S.C. 154(b) by 482 days.

(21) Appl. No.: 16/979,891

(22) PCT Filed: Dec. 20, 2018

(86) PCT No.: PCT/CN2018/122311
§ 371 (c)(1),
(2) Date: Sep. 11, 2020

(87) PCT Pub. No.: WO2019/174345
PCT Pub. Date: Sep. 19, 2019

(65) Prior Publication Data
US 2021/0028037 A1    Jan. 28, 2021

(30) Foreign Application Priority Data
Mar. 12, 2018   (CN) .......................... 201810199082.5

(51) Int. Cl.
*H01L 21/67*       (2006.01)
*H01L 21/673*     (2006.01)
*B65G 47/34*      (2006.01)

(52) U.S. Cl.
CPC ........ *H01L 21/67309* (2013.01); *B65G 47/34* (2013.01)

(58) Field of Classification Search
CPC .... B65G 47/34; H01L 21/67; H01L 21/67309
(Continued)

(56) References Cited

U.S. PATENT DOCUMENTS 5,752,609 A * 5/1998 Kato ................. H01L 21/67309
                                                                    211/41.18
6,171,400 B1 * 1/2001 Wingo .............. H01L 21/67309
                                                                    211/41.18
(Continued)

FOREIGN PATENT DOCUMENTS

CN        1587005 A       3/2005
CN        1836990 A       9/2006
(Continued)

OTHER PUBLICATIONS

US 2002/0113027 A1, Minami et al., Aug. 22, 2002.*
US2022/0048699 A1, Kim et al., Feb. 17, 2022.*
US 2022/0093435 A1, Shinozaki et al., Mar. 24, 2022.*

Primary Examiner — Douglas A Hess
(74) Attorney, Agent, or Firm — Maier & Maier, PLLC (57) ABSTRACT

The present application relates to a base frame of a substrate carrier, including a first vertical rod and a second vertical rod; a plurality of cross rods, being arranged along the lengthwise direction of the first vertical rod and the second vertical rod, and being connected between the first vertical rod and the second vertical rod; a first vertical rod extension, being connected to an end of the first vertical rod from which a substrate enters; and a second vertical rod extension, being connected to an end of the second vertical rod from which the substrate enters; and the first vertical rod extension and
(Continued)

the second vertical rod extension are configured to accommodate at least one set of rollers for conveying the substrate therebetween.

19 Claims, 5 Drawing Sheets

(58) Field of Classification Search
USPC .......................................................... 198/835
See application file for complete search history.

(56) References Cited

U.S. PATENT DOCUMENTS

| | | | |
|---|---|---|---|
| 6,716,027 B2 * | 4/2004 | Kim | H01L 21/67303 |
| | | | 118/728 |
| 7,033,168 B1 * | 4/2006 | Gupta | C30B 25/12 |
| | | | 211/41.18 |
| 8,528,750 B2 * | 9/2013 | Heo | H01L 21/67309 |
| | | | 211/41.18 |
| 9,666,454 B2 * | 5/2017 | Choi | H01L 21/67017 |
| 10,361,108 B2 * | 7/2019 | Gonzalez | H01L 21/67386 |
| 10,446,424 B2 * | 10/2019 | Wang | G03F 7/16 |
| 11,047,044 B2 * | 6/2021 | Takezawa | C23C 16/4583 |
| 11,450,542 B2 * | 9/2022 | Cheng | C23C 16/4583 |
| 11,581,207 B2 * | 2/2023 | Daginnus-Metzen | B65G 1/04 |

FOREIGN PATENT DOCUMENTS

| | | |
|---|---|---|
| CN | 101654175 A | 2/2010 |
| CN | 102308376 A | 1/2012 |
| CN | 102642716 A | 8/2012 |
| CN | 103183182 A | 7/2013 |
| CN | 203237607 U | 10/2013 |
| CN | 103803193 A | 5/2014 |
| CN | 108423406 A | 8/2018 |
| JP | 2008204996 A | 9/2008 |
| JP | 2009001358 A | 1/2009 |

* cited by examiner

BASE FRAME OF SUBSTRATE CARRIER, SUBSTRATE CARRIER AND SUBSTRATE TRANSFER MECHANISM

CROSS-REFERENCE TO RELATED APPLICATIONS'

This application is the International Application No. PCT/CN2018/122311 for entry into US national phase with an international filing date of Dec. 20, 2018, designating US, now pending, and claims priority to Chinese Patent Application No. 201810199082.5, filed on Mar. 12, 2018, the contents of which are incorporated herein by reference.

BACKGROUND

The present application relates to the technical field of display device manufacturing, and in particular to a base frame of a substrate carrier, a substrate carrier and a substrate transfer mechanism.

The statements here only provide background information related to the present application, and do not necessarily constitute prior art. The manufacturing process of the display panel involves the manufacturing and processing of the substrate. The manufacturing of the substrate needs to go through multiple processes, and it is necessary to transfer the substrate through several transfer mechanisms. Specifically, the device for carrying the substrate is placed in the transfer mechanism, the platform of the transfer mechanism is provided with rollers, and the substrate is transferred to the rollers of the platform by conveyer belts, and then enters the carrier for storage. The carrier includes a base frame and a multi-layer structure disposed on the base frame for carrying substrates. There is a wide gap at the docking position of the conveyer belt and the platform. When the substrate flows from the conveyer belt to the rollers, the front edge of the substrate is likely to sink, leading to impact or crooked flow, resulting in substrate fragmenting, which affects substrate yield and causes waste.

SUMMARY

An objective of the present application is to provide a base frame of a substrate carrier, including but not limited to preventing the substrate from impact or crooked flow during conveyance.

The technical solution adopted in an embodiment of the present application is: a base frame of a substrate carrier, including:

a first vertical rod and a second vertical rod;

a plurality of cross rods, arranged along a lengthwise direction of the first vertical rod and the second vertical rod, and connected between the first vertical rod and the second vertical rod;

a first vertical rod extension, connected to an end of the first vertical rod from which a substrate enters; and a second vertical rod extension, connected to an end of the second vertical rod from which the substrate enters; and the first vertical rod extension and the second vertical rod extension are configured to accommodate at least one set of rollers for conveying the substrate therebetween.

In an embodiment, the first vertical rod extension and the second vertical rod extension have a same structure and are arranged mirror-symmetrically.

In an embodiment, the first vertical rod extension is integrally formed with the first vertical rod, and the second vertical rod extension is integrally formed with the second vertical rod.

In an embodiment, the first vertical rod extension includes:

a first vertical rod elongated section, formed by coaxially extending the first vertical rod; and a first vertical rod bend section, formed by bending the first vertical rod elongated section by 90°;

the second vertical rod extension includes:

a second vertical rod elongated extension, formed by coaxially extending the second vertical rod; and a second vertical rod bend section, formed by bending the second vertical rod elongated section by 90°;

and a free end of the first vertical rod bend section and a free end of the second vertical rod bend section are arranged facing to each other.

In an embodiment, the first vertical rod extension is connected to the first vertical rod through a first adjusting member, and the second vertical rod extension is movably connected to the second vertical rod through a second adjusting member, such that a distance between the first vertical rod extension and the second vertical rod extension is adjustable.

In an embodiment, the first vertical rod is provided with a third vertical rod extension at an end away from the end from which the substrate enters, and the second vertical rod is provided with a fourth vertical rod extension at an end away from the end from which the substrate enters.

In an embodiment, the third vertical rod extension and the fourth vertical rod extension have a same structure and are arranged mirror-symmetrically.

In an embodiment, the first vertical rod extension, the second vertical rod extension, the third vertical rod extension, and the fourth vertical rod extension have a same structure.

In an embodiment, the plurality of cross rods are arranged at equal intervals.

In an embodiment, a spacing of a first two cross rods of the base frame is equal to a spacing of a last two cross rods of the base frame, and is smaller than that of the middle cross rods of the base frame.

In an embodiment, the first vertical rod extension is movably connected to the first vertical rod through a first adjusting member, and the second vertical rod extension is movably connected to the second vertical rod through a second adjusting member.

Another objective of the present application is to provide a substrate carrier, including a base frame and a plurality of support structures, the base frame including:

a first vertical rod and a second vertical rod;

a plurality of cross rods, arranged along a lengthwise direction of the first vertical rod and the second vertical rod, and connected between the first vertical rod and the second vertical rod;

a first vertical rod extension, connected to an end of the first vertical rod from which a substrate enters; and a second vertical rod extension, connected to an end of the second vertical rod from which the substrate enters; and the first vertical rod extension and the second vertical rod extension are configured to accommodate at least one set of rollers for conveying the substrate therebetween;

the support structures are arranged side by side on the base frame, supported by the cross rods, respectively, and configured to carrier the substrate;

each of the support structures includes a plurality of support members arranged in stacked layers, and the support members of the plurality of support structures form multiple layers of carrying faces.

In an embodiment, the support structure further includes:

a frame, including two support arms and a plurality of reinforcing arms connected between the two support arms;

the reinforcing arms are parallel to the support members;

one of the reinforcing arms close to the base frame is located on the cross rod; and the two support arms are respectively connected to the first vertical rod and the second vertical rod.

In an embodiment, portions of the two support arms respectively connected to the first vertical rod and the second vertical rod are provided with notches; and the first vertical rod is provided with a first connecting bar, the second vertical rod is provided with a second connecting bar, and the first connecting bar and the second connecting bar are respectively embedded in the notches.

In an embodiment, the support member includes steel wires with smooth surfaces, each of the two support arms defines a plurality of through holes along a lengthwise direction thereof, the through holes of the two support arms are opposite one another respectively in pairs with a same height, and two through holes in each pair with the same height are connected with a steel wire.

In an embodiment, the cross rod is provided with positioners thereon.

Yet another objective of the present application is to provide a substrate transfer mechanism, including:

a platform;

a rolling means, arranged on the platform, and configured to convey a substrate;

a substrate carrier, configured to carry the substrate;

a lifter, configured to drive the substrate carrier to be raised and lowered, such that a plurality of carrying faces of the substrate carrier are aligned with the rolling means step by step to convey the substrate to a corresponding carrying face;

the substrate carrier includes a base frame and a plurality of support structures, and the base frame includes:

a first vertical rod and a second vertical rod;

a plurality of cross rods, arranged along a lengthwise direction of the first vertical rod and the second vertical rod, and connected between the first vertical rod and the second vertical rod;

a first vertical rod extension, connected to an end of the first vertical rod from which a substrate enters; and a second vertical rod extension, connected to an end of the second vertical rod from which the substrate enters; and the first vertical rod extension and the second vertical rod extension are configured to accommodate at least one set of rollers for conveying the substrate therebetween;

the support structures are arranged side by side on the base frame, supported by the cross rods, respectively, and configured to carrier the substrate;

each of the support structures includes a plurality of support members arranged in stacked layers, and the support members of the plurality of support structures form multiple layers of carrying faces; and the rolling means includes a plurality of rows of rollers, and at least one row of rollers is disposed in a corresponding area between the first vertical rod extension and the second vertical rod extension of the base frame at an end from which the substrate enters.

According to the base frame of the substrate carrier provided by the embodiments of the present application, the first vertical rod and the second vertical rod are connected to the first vertical rod extension and the second vertical rod extension at the corresponding ends from which to the substrate enters, at least one set of rollers for conveying the substrate can be accommodated between the first vertical rod extension and the second vertical rod extension, that is, there is an unoccupied space between the two, one or more sets of rollers can be added to the corresponding area between the two on the platform of the substrate transfer mechanism, so as to narrow the spacing between the conveyer belt and the rollers, which allows the substrate to flow smoothly to the rollers and to the substrate carrier, thereby solving the problem of fragment. In addition, the design of the first vertical rod extension and the second vertical rod extension makes the base frame suitable for different types of storage modes, making the base frame and the substrate carrier including the base frame more applicable.

According to the substrate transfer mechanism provided by the embodiments of the present application, rollers can be added on the junction of the platform and the conveyer belt, which narrows the width of the connecting area, thereby avoiding substrate fragment.

DESCRIPTION OF THE DRAWINGS

In order to more clearly describe the technical solutions in the embodiments of the present application, the drawings that need to be used in the embodiments or exemplary technical descriptions will be briefly introduced in the following. Obviously, the drawings in the following description are only some embodiments of the present application, and for those of ordinary skill in the art, other drawings can also be obtained on the basis of these drawings without paying creative work.

DETAILED DESCRIPTION OF THE EMBODIMENTS

In order to make the objective, technical solutions, and advantages of the present application clearer, the present application will be further described in detail in the following with reference to the accompanying drawings and embodiments. It should be understood that the specific embodiments described herein are intended to explain the present invention, but are not intended to limit the present application.

It should be noted that when a component is referred to as being "fixed to/on" or "arranged/disposed on/in/at" another component, it may be directly or indirectly located on/in the other component. When a component is referred to as being "connected to" another component, it may be directly or indirectly connected to the other component. The orientation or positional relationship indicated by terms, such as "up", "down", "left", "right", or the like, is based on the orientation or positional relationship shown in the drawings, is only for convenience of description and do not indicate or imply that the device or element referred to must have a specific orientation or be constructed and operated in a specific orientation, and therefore cannot be understood as a limitation of the present application. For those of ordinary skill in the art, the specific meaning of the above terms can be understood according to specific conditions. The terms "first" and "second" are only used for convenience of description, and cannot be understood as indicating or implying relative importance or implicitly indicating the number of technical features. The meaning of "a/the plurality of" is two or more, unless specifically defined otherwise.

In order to illustrate the technical solutions described in the present application, detailed descriptions are given below combination with specific drawings and embodiments.

Referring to FIG. 1 to FIG. 4, an embodiment of the present application provides a base frame 11 of a substrate carrier, and the base frame 11 is a portion of the substrate carrier 10. The base frame 11 and support structures 12 connected by the base frame 11 constitute the substrate carrier 10 for carrying a substrate 20, such as a glass substrate and other plates. The base frame 11 of the substrate carrier (hereinafter referred to as the "base frame 11") includes a first vertical rod 111, a second vertical rod 112, and a plurality of cross rods 113, where the cross rods 113 are arranged in sequence along the lengthwise direction of the first vertical rod 111 and the second vertical rod 112, and each of which is connected between the first vertical rod 111 and the second vertical rod 112. The base frame 11 further includes a first vertical rod extension 114 connected to a corresponding end of the first vertical rod 111 from which the substrate 20 enters, and a second vertical rod extension 115 connected to a corresponding end of the second vertical rod 112 from which the substrate 20 enters, where at least one set of rollers for conveying the substrate 20 can be accommodated between the first vertical rod extension 114 and the second vertical rod extension 115.

Figure 1:
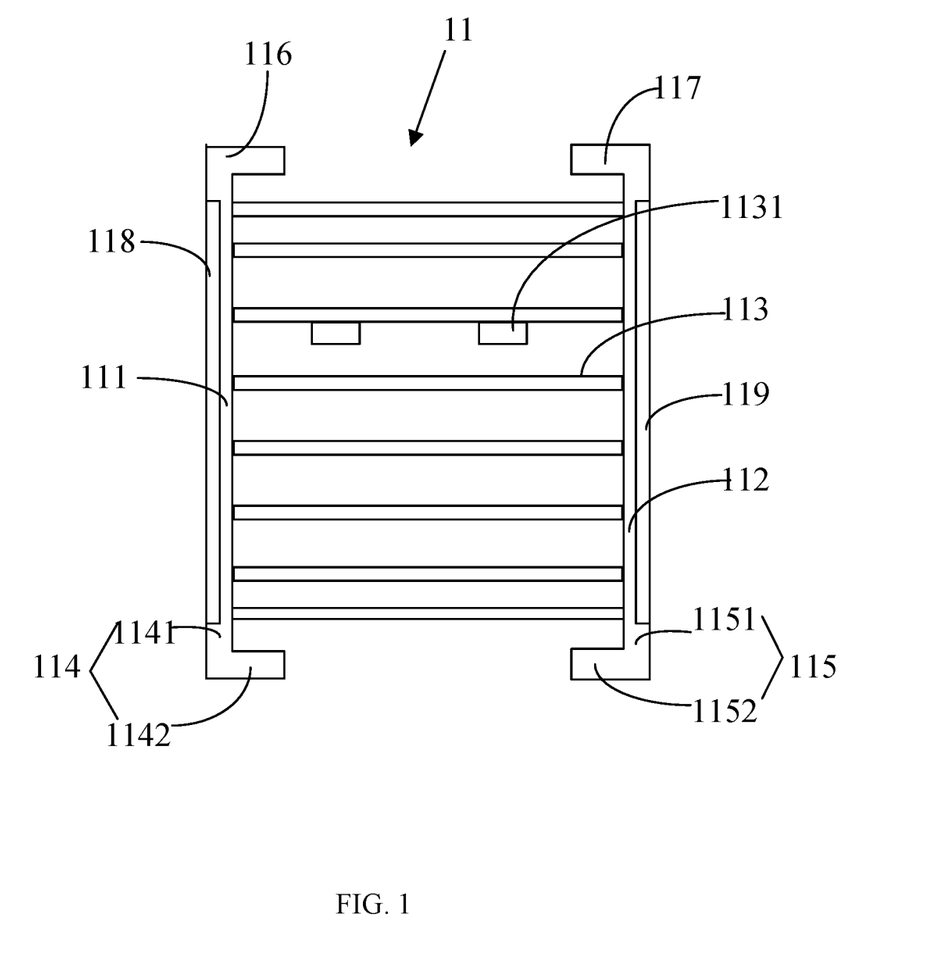
FIG. 1 is a schematic diagram showing a structure of a base frame of a substrate carrier according to an embodiment of the present application.
Figure 2:
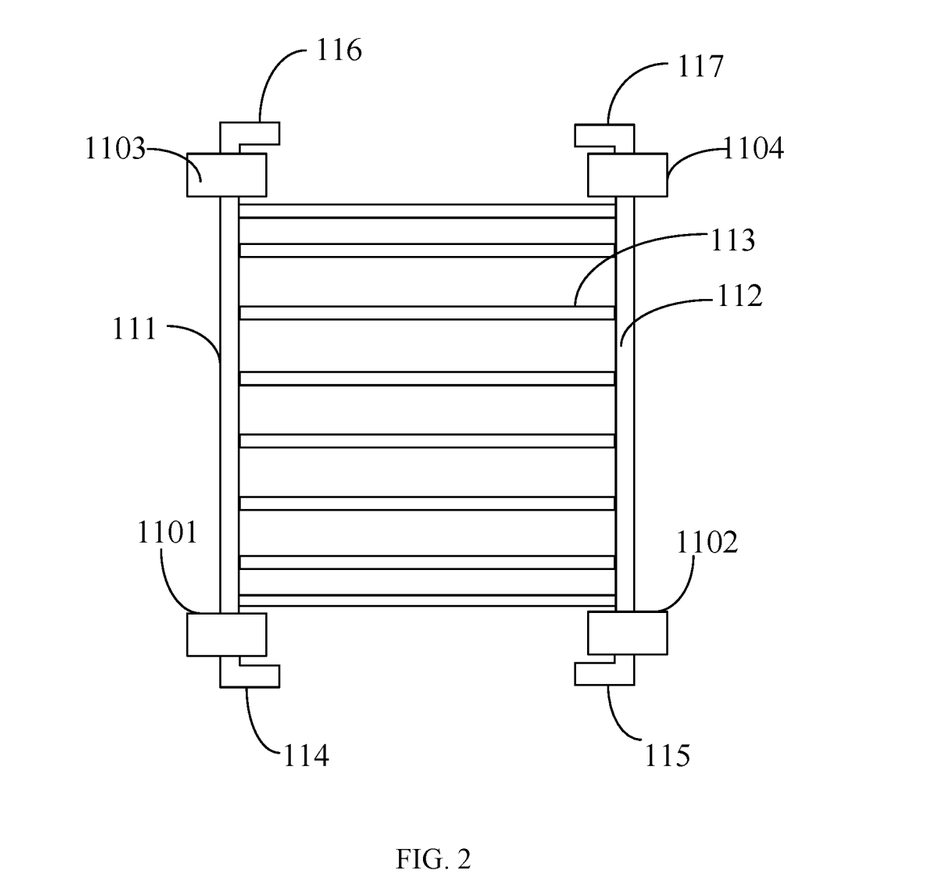
FIG. 2 is schematic diagram showing another structure of a base frame of a substrate carrier according to an embodiment of the present application.
Figure 3:
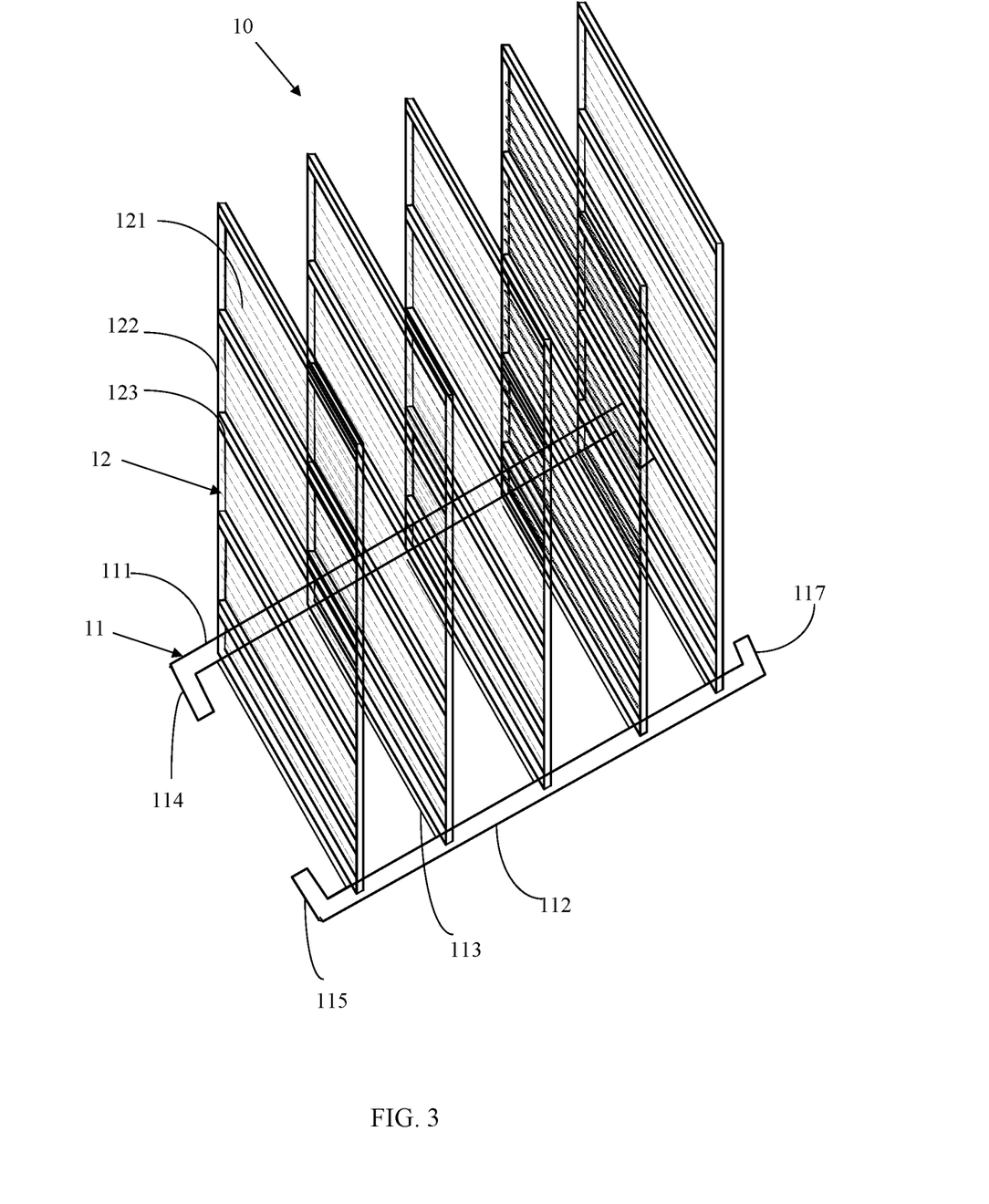
FIG. 3 is a schematic diagram showing a structure of a substrate carrier according to an embodiment of the present application.

The first vertical rod 111, the second vertical rod 112, and the plurality of cross rods 113 connected therebetween constitute a two-dimensional frame structure. The distance between adjacent cross rods of the plurality of cross rods 113 depends on the width of the substrate 20 carried, and is generally smaller than one half of the dimension of the substrate 20 in the lengthwise direction of the first vertical rod 111 and the second vertical rod 112, such that the support structures 12 installed on the cross rods 113 can stably carry the substrate 20. The first vertical rod extension 114 and the second vertical rod extension 115 are directly or indirectly connected to the first vertical rod 111 and the second vertical rod 112, respectively, the ends of the two are not connected with each other, and the distance between the two is greater than the width of the roller for conveying the substrate 20, with the purpose of providing an avoidance space for installing the roller to prevent the substrate 20 from fragmenting. The principle is as described in the following.

Figure 6:
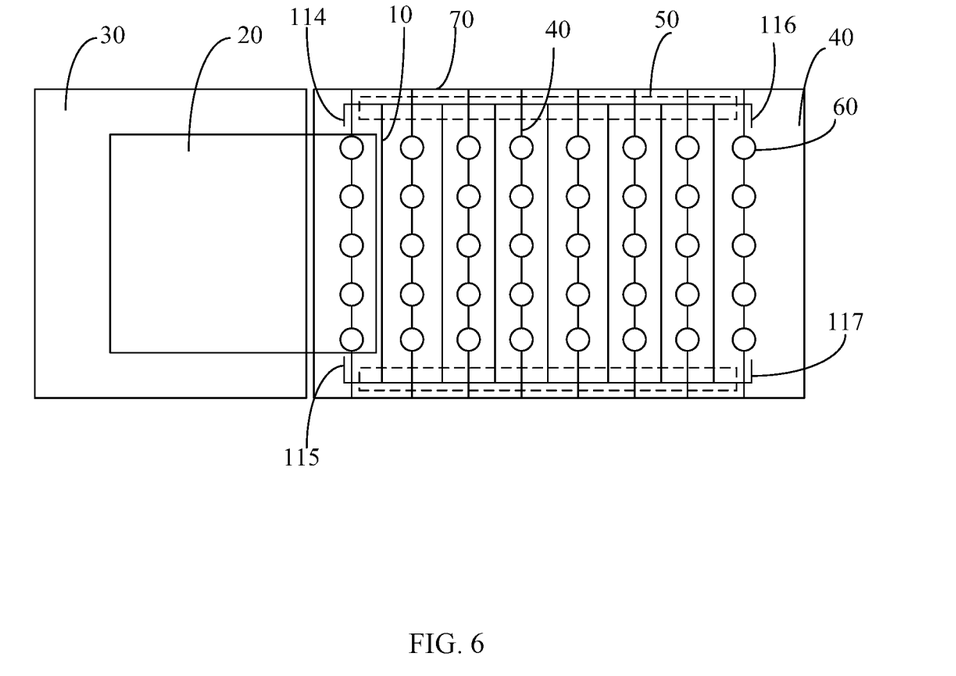
FIG. 6 is a schematic diagram showing a structure of a substrate transfer mechanism according to an embodiment of the present application.

The traditional base frame 11 has a rectangular frame structure, a plurality of cross rods are arranged inside the rectangular frame, and two ends of a first vertical rod and a second vertical rod are respectively connected with a cross rod, that is, the two ends do not extend outward. With the base frame 11 of the embodiments of the present application, it is equivalent to moving the cross rod 113 inward for a certain distance at a corresponding end of the first vertical rod 111 and the second vertical rod 112 from which the substrate 20 enters, ensuring that the most distal ends of the first vertical rod 111 and the second vertical rod 112 (corresponding to the end from which the substrate 20 enters) extend freely without reducing the number of the cross rods 113, such that the distal ends of the first vertical rod 111 and the second vertical rod 112 are in an unoccupied state. In this way, when it is used in the substrate carrier 10, the base frame 11 can cooperate with the roller to solve the above-mentioned problem of fragment. The specific principle is as follows:

Referring to FIG. 6, firstly, the basic framework and operating mode of the substrate transfer system will be explained. The system includes a conveyer belt 30 and a substrate transfer mechanism, which are connected with each other, and the substrate carrier 10 is placed in the substrate transfer mechanism. The conveyer belt 30 is configured to convey the substrate 20, and the substrate transfer mechanism is configured to finally load the substrate 20 into the substrate carrier 10. The substrate transfer mechanism at least includes a platform 40 and a lifter 50 that can be raised and lowered. The platform 40 is provided with a rolling means, and the rolling means includes multiple rows of rollers 60. The platform 40 and its rollers 60 have the same height with the conveyer belt 30 and are connected to the same. The above-mentioned substrate carrier 10 is installed on the lifter 50, and the rollers 60 are inserted into the gaps of the substrate carrier 10. The lifter 50 can be raised and lowered relative to the platform 40 to drive the substrate carrier 10 to be raised and lowered, and of course, the structure of the platform 40 will not interfere with the up and down movement of the lifter 50. Also referring to FIG. 3 and FIG. 4, the support structures 12 of the substrate carrier 10 forms a plurality of carrying faces parallel to the base frame 11 with different heights. During the lifting process of the substrate carrier 10, several carrying faces of the substrate carrier 10 are aligned with the height of the rollers 60 one by one, and the substrate 20 is conveyed to the corresponding carrying face through the rollers 60, and then loaded into the substrate carrier 10.

In the exemplary technique, the cross rod 113 at the most distal end of the base frame 11 (that is, the junction of the platform 40 and the conveyer belt 30) is located at the most distal end of the platform 40, and a support structure 12 is installed thereon, in order to avoid interference between the cross rod 113 or the support structure 12 on the cross rod 113 and the rollers 60, the rollers 60 will not be installed here, then the width of this part is relatively large, and there is no roller 60 nearby to carry the substrate 20, so when the substrate 20 flows from the conveyer belt 30 to the rollers 60, the front edge of the substrate 20 is likely to sink here, and then hits the cross rod 113, the rollers 60 or the platform 40, resulting in fragment. In this embodiment, the cross rod 113 at the most distal end is moved backward to form an unoccupied space between the first vertical rod extension 114 and the second vertical rod extension 115, in this way, one or more sets of rollers 60 can be added in the corresponding area on the platform 40 between the first vertical rod extension 114 and the second vertical rod extension 115, and the distance between the conveyer belt 30 and the rollers 60 can be narrowed, such that the substrate 20 smoothly flows to the rollers 60 and to the support structure 12, thereby solving the problem of fragment.

In this embodiment, the inflow and outflow of the substrate 20 are reversible processes. Both ends of the platform 40 are connected to the conveyer belts 30, one end serves as an inlet, the other end serves as an outlet, or the same end serves as an inlet and an outlet in different processes. When the substrate 20 is stored in the substrate carrier 10, if it is to be taken out, the substrate carrier 10 can be moved up and down, such that the substrate 20 on each carrying face is in contact with the rollers 60 in turn, and the substrate 20 is transported to the conveyer belt 30 through the rollers 60 to convey the substrate 20 out. In the same way, since at least one row of rollers 60 is added between the first vertical rod extension 114 and the second vertical rod extension 115 of the base frame 11, the substrate 20 can also avoid hitting the conveyer belt 30 when it flows out, thereby avoiding fragment.

At the same time, the first vertical rod extension 114 and the second vertical rod extension 115 are suitable for different types of storage modes. For example, in a storage mode, the first vertical rod extension 114 and the second vertical rod extension 115 may not be used for movement or placement, while in another storage mode, the first vertical rod extension 114 and the second vertical rod extension 115 need to be used for movement or placement, such that the base frame 11 has better applicability.

In an embodiment of the present application, the first vertical rod 111 and the second vertical rod 112 are parallel, the cross rods 113 are perpendicular to the first vertical rod 111 and the second vertical rod 112, the first vertical rod 111, the second vertical rod 112 and the cross rods 113 constitute a two-dimensional base frame 11, and the support structures 12 are installed at the cross rods 113 to form the substrate carrier 10. Specifically, the first vertical rod extension 114 and the first vertical rod 111 are integrally formed, and the second vertical rod extension 115 and the second vertical rod 112 are integrally formed. The first vertical rod 111, the second vertical rod 112, and the cross rods 113 may be connected by welding, or the base frame 11 may be directly formed by an integral molding.

In an embodiment, the first vertical rod extension 114 and the second vertical rod extension 115 have the same structure and are arranged symmetrically, which is convenient for manufacturing and facilitates storage management. The lengths of the first vertical rod 111, the second vertical rod 112, and the cross rods 113 depend on the dimension of the substrate 20. The length of the first vertical rod 111 and the second vertical rod 112 is greater than the dimension of the substrate 20 in the lengthwise direction of the first vertical rod 111 and the second vertical rod 112. The length of the cross rods 113 is greater than the dimension of the substrate 20 in the lengthwise direction of the cross rods 113. The size and shape of the first vertical rod extension 114 and the second vertical rod extension 115 are determined according to the convenience of placement or pickup in the storage management.

As shown in FIG. 1, in an embodiment, positioners 1131 may be provided on the outer wall of one or several cross rods 113, the positioners 1131 is configured to position the corresponding conveying-carrying equipment when conveying the substrate carrier 10, so as to ensure that the substrate carrier 10 does not shake. For example, the positioners 1131 may be convex block structure, and concave blocks may be provided on the corresponding conveying-carrying mechanism to cooperate with them. In other embodiments, the positioners 1131 may also be snaps, and the corresponding conveying-carrying mechanism is provided with snap receivers to cooperate with them. Other types of positioners may also be used, which will not be listed in this embodiment one by one.

As an embodiment of the first vertical rod extension 114 and the second vertical rod extension 115, the first vertical rod extension 114 and the first vertical rod 111 are integrally formed, and the second vertical rod extension 115 and the second vertical rod 112 is integrally formed. In this way, the base frame is easy to be manufactured, and the base frame has a high structure intensity and is not easy to be damaged.

Referring to FIG. 1, the first vertical rod extension 114 includes a first vertical rod elongated section 1141 that is formed by coaxially extending the first vertical rod 111, and the first vertical rod extension 114 also includes a first vertical rod bend section 1142 that is formed by bending the first vertical rod elongated section 1141 by 90°; the second vertical rod extension 115 includes a second vertical rod elongated section 1151 that is formed by coaxially extending the second vertical rod 112, and the second vertical rod extension 115 also includes a second vertical rod bend section 1152 that is formed by bending the second vertical rod elongated section 1151 by 90°; and the first vertical rod bend section 1142 and the second vertical rod bend section 1152 are arranged facing to each other. In this way, the first vertical rod extension 114 and the second vertical rod extension 115 are both right-angled and symmetrical. Such a design can facilitate the placement and management of the substrate carrier 10. For example, in a storage system, the substrate carrier 10 needs to be placed or moved with the help of the first vertical rod extension 114 and the second vertical rod extension 115.

As an implementation of this embodiment, the total length of the base frame (the length along the direction in which the substrate enters) is 2720±2 mm, and the total width is 2410 mm. The length of the first vertical rod 111 and the second vertical rod 112 is 2590±2 mm, the length of the cross rods 113 is 2310 mm, the length of the first vertical rod elongated section 1141 and the second vertical rod elongated section 1151 is 65 mm, the length of the first vertical rod bend section 1142 and the second vertical rod bend section 1152 is 35 mm, and the maximum length from the outer sidewall of the first vertical rod elongated section 1141 to the end of the first vertical rod bend section 1142 is 85 mm. The diameter of the first vertical rod bend section 1142 and the second vertical rod bend section 1152 can be the same as that of the first vertical rod elongated section 1141 and the second vertical rod elongated section 1151 respectively, both of which are 50 mm. The diagonal length of the substrate with the largest dimension that the base frame can carry is 3629±3 mm. Of course, the diameter of the first vertical rod bend section 1142 and the second vertical rod bend section 1152 can be greater than that of the first vertical rod elongated section 1141 and the second vertical rod elongated section 1151 respectively; or alternatively, the diameter of the first vertical rod bend section 1142 and the second vertical rod bend section 1152 can be smaller than that of the first vertical rod elongated section 1141 and the second vertical rod elongated section 1151 respectively.

Referring to FIG. 2, as another embodiment of the first vertical rod extension 114 and the second vertical rod extension 115, both the first vertical rod extension 114 and the second vertical rod extension 115 may be designed as structures with movable connection, that is, the first vertical rod extension 114 can be, but is not limited to be, connected to the first vertical rod 111 through a adjusting member 1101, such that the first vertical rod extension 114 is movable, and the moving direction may include a direction perpendicular to the first vertical rod 111 and a direction parallel to the first vertical rod 111; the second vertical rod extension 115 can be, but is not limited to be, movably connected to the second vertical rod 112 through a second adjusting member 1102, such that the second vertical rod extension 115 is movable, and the moving direction may include a direction perpendicular to the second vertical rod 112 and a direction parallel to the second vertical rod 112. In this way, the first vertical rod extension 114 and the second vertical rod extension 115 respectively move relative to each other based on the adjustment of the first adjusting member 1101 and the second adjusting member 1102, such that the distance between the two, the distance between first vertical rod extension 114 and the first vertical rod 111, and the distance between the second vertical rod extension 115 and the second vertical rod 112 can be changed. Such a design enables the base frame 11 and the substrate carrier 10 using the base frame 11 to adapt to storage equipment of different structures and dimensions. For example, when the width of the clamping mechanism for installing the substrate carrier 10 is different, the positions of the first vertical rod extension 114 and the second vertical rod extension 115 can be adjusted to adapt to different clamping mechanisms.

As an embodiment of the first adjusting member and the second adjusting member, the first adjusting member 1101 and the second adjusting member 1102 may be telescopic nested structures, the first adjusting member 1101 includes at least two telescopic bars that are sleeved with each other, with one bar being connected to the end of the first vertical rod 111, and the other bar being connected to the first vertical rod extension 114, and the position of the first vertical rod extension 114 is adjusted by a telescopic movement. The structure and principle of the second adjusting member can refer to the first adjusting member.

As another embodiment of the first adjusting member 1101 and the second adjusting member 1102, still taking the first adjusting member as an example, the first adjusting member 1101 includes a block connected to the first vertical rod and a slide rail disposed on the block. Correspondingly, the first vertical rod extension 114 is provided with a sliding structure such as a sliding groove connected to the slide rail. By the cooperation of the slide rail and the sliding groove, the first vertical rod extension 114 can slide on the slide rail in the direction toward or away from the first vertical rod 111. When sliding to a preset position, the first vertical rod extension 114 can be locked by a locking member. Further, the positions of the first vertical rod extension 114 and the second vertical rod extension 115 are adjusted. The structure and principle of the second adjusting member 1102 can refer to the first adjusting member.

Referring to FIG. 1 and FIG. 2, in an embodiment, the first vertical rod 111 is provided with a third vertical rod extension 116 at an end away from the end from which the substrate 20 enters, and the second vertical rod 112 is provided with a fourth vertical rod extension 117 at an end away from the end from which the substrate 20 enters. The first vertical rod extension 114, the second vertical rod extension 115, the third vertical rod extension 116, and the fourth vertical rod extension 117 have the same structure and are arranged center-symmetrical. That is, the third vertical rod extension 116 and the fourth vertical rod extension 117 may be integrally formed with or movably connected to the first vertical rod 111 and the second vertical rod 112 respectively. As shown in FIG. 2, the third vertical rod extension 116 and the fourth vertical rod extension 117 are connected to the first vertical rod 111 and the second vertical rod 112 through a third adjusting member 1103 and a fourth adjusting member 1104, respectively. The third vertical rod extension 116 and the fourth vertical rod extension 117 are disposed at the other end of the first vertical rod 111 and the second vertical rod 112, it is equivalent to moving the cross rod 113 at the tail end of the base frame 11 (the end away from the substrate 20) inward, leaving the tail ends of the first vertical rod 111 and the second vertical rod 112 unoccupied, in this way, one or more sets of rollers 60 can be added to in the corresponding area on the platform 40 between the third vertical rod extension 116 and the fourth vertical rod extension 117, such that the substrate 20 can be conveyed more stably. In addition, the structure of the base frame 11 is made symmetrical, which is convenient for manufacturing and storage management.

In the case that the third vertical rod extension 116 and the fourth vertical rod extension 117 are provided, the end corresponding to the first vertical rod extension 114 and the second vertical rod extension 115 may serve as the inflow end of the substrate 20, and the end corresponding to the third vertical rod extension 116 and the fourth vertical rod extension 117 may serve as the outflow end. Or alternatively, the end corresponding to the third vertical rod extension 116 and the fourth vertical rod extension 117 serves as the inflow end of the substrate 20, and the end corresponding to the first vertical rod extension 114 and the second vertical rod extension 115 serves as the outflow end. Or alternatively, the end corresponding to the first vertical rod extension 114 and the second vertical rod extension 115 may serve as the inflow end and the outflow end of the substrate 20 in different processes. Or alternatively, the end corresponding to the third vertical rod extension 116 and the fourth vertical rod extension 117 serves as the inflow end and the outflow end of the substrate 20 in different processes.

With the base frame 11 provided in the embodiment of the present application, it is equivalent to adding rollers 60 on the machine 40 while the number of cross rods 113 of the base frame 11 remains unchanged. Therefore, upon considering the convenience of manufacturing, on the basis of maintaining the original manufacturing process of the base frame 11, it is possible to adjust only the positions of the cross rods 113 at the frontmost end and the rearmost end of the base frame 11 and, at the same time, to design the shape of the first vertical rod extension 114 and the second vertical rod extension 115. Of course, the positions of other cross rods 113 can also be changed to make the distance between adjacent cross rods 113 consistent, which is not limited in this embodiment.

Based on the above-mentioned base frame structure, the present application also provides a substrate carrier 10, as shown in FIG. 2. The substrate carrier 10 includes the above-mentioned base frame 11 and a plurality of support structures 12, and the plurality of support structures 12 are arranged side by side on the base frame 11. The support structures 12 are supported by the cross rods 113, respectively. The support structure 12 is generally a two-dimensional plane structure. Each support structure 12 includes a plurality of support members 121 arranged in stacked layers. When the support structure 12 is installed on the base frame 11, the support members 121 and the cross rod 113 are parallel, the entire support structure 12 and the cross rod 113 are in the same plane, and a plurality of support structures 12 are arranged in parallel. The support members 121 of the plurality of support structures 12 at the same height form a carrying face, and in this way, multiple layers of support members 121 can form a plurality of carrying faces. In an embodiment, the carrying faces may vary from several to several hundred or even more layers.

In an embodiment, the support member 121 may be rigid wires with a smooth surface to avoid scratching the substrate 20. The intensity of the support member 121 meets the requirement of stably carrying the substrate 20, and multiple rigid wires at the same height form a carrying face.

As an embodiment of the support member 121, the support member 121 may include a steel wire and a soft and smooth cladding layer wrapped on the outer surface of the steel wire for protecting the surface of the substrate 20 from scratches. The cladding layer may be made of PEEK (polyetheretherketone) material. In an embodiment, the support structure 12 further includes a frame, the frame at least includes two support arms 122 and a plurality of reinforcing arms 123 connected between the two support arms 122, and the support arms 122 and the reinforcing arms 123 form a grid frame. The reinforcing arm 123 is parallel to the support member 121, both ends of the support member 121 are also connected to the two support arms 122 respectively, and the reinforcing arm 123 near the base frame 11 is directly installed on the cross rod 113. The two support arms 122 are respectively connected to the first vertical rod 111 and the second vertical rod 112, and fixed to the first vertical rod 111 and the second vertical rod 112 by connectors or the like, so as to maintain the stability of the entire substrate carrier 10.

Figure 4:
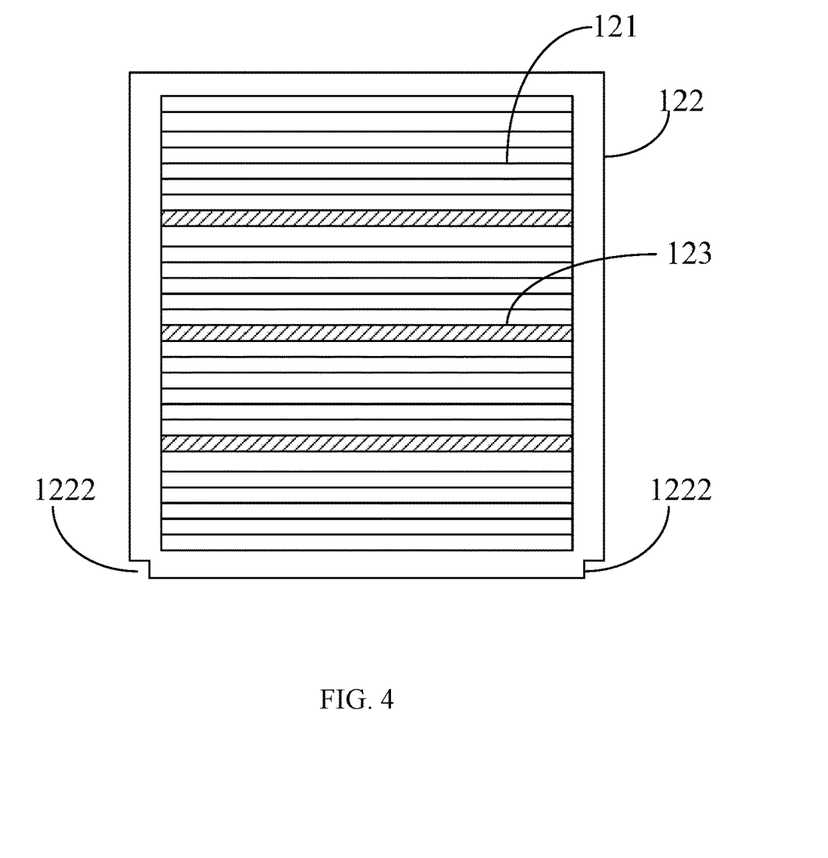
FIG. 4 is a schematic diagram showing a support structure of a substrate carrier according to an embodiment of the present application.

In one embodiment, as shown in FIG. 4, in order to facilitate the stable connection of the support member 121, the support arm 122 defines a plurality of through holes 1221 along its lengthwise direction, and the through holes 1221 of the two support arms 122 are opposite one another respectively in pairs and each pair has a same height. Two through holes 1221 in each pair with the same height are configured to connect a support member 121. One end of the support member 121 passes through the through hole 1221 and then is fixed by a locking member, and the other end is connected to a spring, which passes through the hole 1221 and then is fixed by a locking member. In this way, one end is connected to a spring, such that the tension of the support member 121 can be adjusted, and different degrees of tension can be achieved through the locking member at the other end.

Referring to FIG. 1, in order to achieve a stable connection between the base frame 11 and the support structure 12, a first connecting bar 118 is provided on the first vertical rod 111 of the base frame 11, and a second connecting bar 119 is provided on the second vertical rod 112, one end of each of the two support arms 122 of the structure 12 (the end close to the cross rod 113) is provided with a notch 1222. When installing the support structure 12, the reinforcing arm 123 at the bottom end is seated on the cross rod 113, at the same time, the notches 1222 of the two support arms 122 are respectively aligned with the first connecting bar 118 and the second connecting bar 119, such that the first connecting bar 118 and the second connecting bar 119 are respectively embedded in the two notches 1222, then the first connecting bar 118 and one support arm 122 are connected by a connector, and the second connecting bar 119 and another support arm 122 are connected by a connector.

Figure 5:
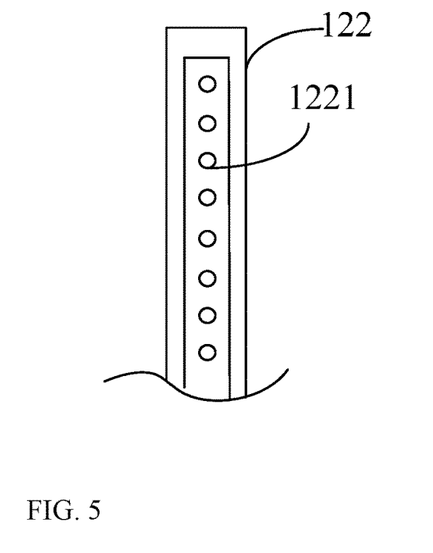
FIG. 5 is a schematic diagram showing a partial structure of a support arm of a substrate carrier according to an embodiment of the present application.

Based on the above-mentioned substrate carrier 10, the present application further provides a substrate transfer mechanism. Referring to FIG. 5, the substrate transfer mechanism includes: a platform 40; a rolling means disposed on the platform 40 for conveying the substrate 20; and a lifter 50, where the lifter 50 is configured to drive the above-mentioned substrate carrier 10 to be raised and lowered, such that the plurality of carrying faces of the substrate carrier 10 correspond to the rolling means step by step to convey the substrate 20 to the corresponding carrying face. Where, the rolling means includes multiple rows of rollers 60, and at the end from which the substrate 20 enters, at least one row of rollers 60 is disposed in the corresponding area between the first vertical rod extension 114 and the second vertical rod extension 115 of the base frame 11.

Specifically, the two ends of the rollers 60 are connected to the two mounting members 70 of the platform 40, the substrate carrier 10 is placed between the two mounting members 70. The rollers 60 are inserted between the support structures 12 of the substrate carrier 10, and the rollers 60 and the support structure 12 are misaligned to avoid interference with the support members 121. The lifter 50 drives the substrate carrier 10 to be raised and lowered while the rollers 60 do not move, such that the rollers 60 correspond to the support member 121 of different heights, thereby placing the substrates 20 onto the substrate carrier 10 piece by piece.

Since the platform 40 is provided with at least one row of rollers 60 in the corresponding area between the first vertical rod extension 114 and the second vertical rod extension 115, the substrate 20 can be conveyed from the conveyer belt 30 to the rollers 60 with a smooth junction, so as to avoid impact.

In an embodiment, the lifter 50 can be connected to the platform 40 or be arranged independently of the platform 40.

In another embodiment, corresponding to the case that the first vertical rod 111 and the second vertical rod 112 of the base frame 11 are respectively provided with a third vertical rod extension 116 and a fourth vertical rod extension 117, at least one row of rollers 60 is further provided on the platform 40 in the corresponding area between the third vertical rod extension 116 and the fourth vertical rod extension 117 to make the conveyance of the substrate 20 more stable.

The above are only optional embodiments of the present application, and are not intended to limit the present application. For those of ordinary skill in the art, the present application can have various modifications and changes. Any modifications, equivalent replacements, and improvements made within the spirit and principle of the present application shall be included in the scope of the claims of the present application.

What is claimed is:

1. A base frame of a substrate carrier, comprising:
a first vertical rod and a second vertical rod;
a plurality of cross rods, arranged along a lengthwise direction of the first vertical rod and the second vertical rod, and connected between the first vertical rod and the second vertical rod;
a first vertical rod extension, connected to an end of the first vertical rod from which a substrate enters; and
a second vertical rod extension, connected to an end of the second vertical rod from which the substrate enters;
wherein the first vertical rod extension and the second vertical rod extension are configured to accommodate at least one set of rollers for conveying the substrate therebetween.

2. The base frame of the substrate carrier according to claim 1, wherein the first vertical rod extension and the second vertical rod extension have a same structure and are arranged mirror-symmetrically.

3. The base frame of the substrate carrier according to claim 1, wherein the first vertical rod extension is integrally formed with the first vertical rod, and the second vertical rod extension is integrally formed with the second vertical rod.

4. The base frame of the substrate carrier according to claim 3, wherein the first vertical rod extension comprises:
a first vertical rod elongated section, formed by coaxially extending the first vertical rod; and
a first vertical rod bend section, formed by bending the first vertical rod elongated section by 90°;

the second vertical rod extension comprises:
a second vertical rod elongated extension, formed by coaxially extending the second vertical rod; and
a second vertical rod bend section, formed by bending the second vertical rod elongated section by 90°;
and a free end of the first vertical rod bend section and a free end of the second vertical rod bend section are arranged facing to each other.

5. The base frame of the substrate carrier according to claim 1, wherein the first vertical rod extension is connected to the first vertical rod through a first adjusting member, and the second vertical rod extension is movably connected to the second vertical rod through a second adjusting member, such that a distance between the first vertical rod extension and the second vertical rod extension is adjustable.

6. The base frame of the substrate carrier according to claim 1, wherein the first vertical rod is provided with a third vertical rod extension at an end away from the end from which the substrate enters, and the second vertical rod is provided with a fourth vertical rod extension at an end away from the end from which the substrate enters.

7. The base frame of the substrate carrier according to claim 6, wherein the third vertical rod extension and the fourth vertical rod extension have a same structure and are arranged mirror-symmetrically.

8. The base frame of the substrate carrier according to claim 6, wherein the first vertical rod extension, the second vertical rod extension, the third vertical rod extension, and the fourth vertical rod extension have a same structure.

9. The base frame of the substrate carrier according to claim 1, wherein the plurality of cross rods are arranged at equal intervals.

10. The base frame of the substrate carrier according to claim 1, wherein a spacing of a first two cross rods of the base frame is equal to a spacing of a last two cross rods of the base frame, and is smaller than that of the middle cross rods of the base frame.

11. The base frame of the substrate carrier according to claim 1, wherein the first vertical rod extension is movably connected to the first vertical rod through a first adjusting member, and the second vertical rod extension is movably connected to the second vertical rod through a second adjusting member.

12. A substrate carrier, comprising a base frame and a plurality of support structures, wherein the base frame comprising:
a first vertical rod and a second vertical rod;
a plurality of cross rods, arranged along a lengthwise direction of the first vertical rod and the second vertical rod, and connected between the first vertical rod and the second vertical rod;
a first vertical rod extension, connected to an end of the first vertical rod from which a substrate enters; and
a second vertical rod extension, connected to an end of the second vertical rod from which the substrate enters;
wherein the first vertical rod extension and the second vertical rod extension are configured to accommodate at least one set of rollers for conveying the substrate therebetween;
the support structures are arranged side by side on the base frame, supported by the cross rods, respectively, and configured to carrier the substrate;
each of the support structures comprises a plurality of support members arranged in stacked layers, and the support members of the plurality of support structures form multiple layers of carrying faces.

13. The substrate carrier according to claim 12, wherein the support structure further comprises:
a frame, comprising two support arms and a plurality of reinforcing arms connected between the two support arms; wherein
the reinforcing arms are parallel to the support members;
one of the reinforcing arms close to the base frame is located on the cross rod; and
the two support arms are respectively connected to the first vertical rod and the second vertical rod.

14. The substrate carrier according to claim 12, wherein portions of the two support arms respectively connected to the first vertical rod and the second vertical rod are provided with notches; and the first vertical rod is provided with a first connecting bar, the second vertical rod is provided with a second connecting bar, and the first connecting bar and the second connecting bar are respectively embedded in the notches.

15. The substrate carrier according to claim 12, wherein the support member comprises steel wires with smooth surfaces, each of the two support arms defines a plurality of through holes along a lengthwise direction thereof, the through holes of the two support arms are opposite one another respectively in pairs with a same height, and two through holes in each pair with the same height are connected with a steel wire.

16. The substrate carrier of claim 12, wherein the cross rod is provided with positioners thereon.

17. A substrate transfer mechanism, comprising:
a platform;
a rolling means, arranged on the platform, and configured to convey a substrate;
a substrate carrier, configured to carry the substrate;
a lifter, configured to drive the substrate carrier to be raised and lowered, such that a plurality of carrying faces of the substrate carrier are aligned with the rolling means step by step to convey the substrate to a corresponding carrying face;
wherein the substrate carrier comprises a base frame and a plurality of support structures, and the base frame comprises:
a first vertical rod and a second vertical rod;
a plurality of cross rods, arranged along a lengthwise direction of the first vertical rod and the second vertical rod, and connected between the first vertical rod and the second vertical rod;
a first vertical rod extension, connected to an end of the first vertical rod from which a substrate enters; and
a second vertical rod extension, connected to an end of the second vertical rod from which the substrate enters;
wherein the first vertical rod extension and the second vertical rod extension are configured to accommodate at least one set of rollers for conveying the substrate therebetween;
the support structures are arranged side by side on the base frame, supported by the cross rods, respectively, and configured to carrier the substrate;
each of the support structures comprises a plurality of support members arranged in stacked layers, and the support members of the plurality of support structures form multiple layers of carrying faces; and
the rolling means comprises a plurality of rows of rollers, and at least one row of rollers is disposed in a corresponding area between the first vertical rod extension and the second vertical rod extension of the base frame at an end from which the substrate enters.

18. The substrate transfer mechanism according to claim 17, wherein the first vertical rod of the base frame is provided with a third vertical rod extension at an end away from the end from which the substrate enters, and the second vertical rod of the base frame is provided with a fourth vertical rod extension at an end away from the end from which the substrate enters, and at least one row of rollers is provided in a corresponding area between the third vertical rod extension and the fourth vertical rod extension.

19. The substrate transfer mechanism according to claim 17, wherein mounting members are provided on opposite sides of the platform, two ends of the rollers are connected to two mounting members of the platform, the substrate carrier is arranged between the two mounting members, and the rollers is inserted between the support structures of the substrate carrier.

* * * * *